US006704912B2

(12) United States Patent
Narain et al.

(10) Patent No.: US 6,704,912 B2
(45) Date of Patent: Mar. 9, 2004

(54) METHOD AND APPARATUS FOR CHARACTERIZING INFORMATION ABOUT DESIGN ATTRIBUTES

(75) Inventors: Prakash Narain, San Carlos, CA (US); Rajeev K. Ranjan, Santa Clara, CA (US); Christopher R. Morrison, Sunnyvale, CA (US); John M. Beardslee, Menlo Park, CA (US)

(73) Assignee: Real Intent, Inc., Santa Clara, CA (US)

( * ) Notice: Subject to any disclaimer, the term of this patent is extended or adjusted under 35 U.S.C. 154(b) by 126 days.

(21) Appl. No.: 09/770,068

(22) Filed: Jan. 24, 2001

(65) Prior Publication Data

US 2003/0229863 A1 Dec. 11, 2003

(51) Int. Cl.[7] .............................................. G06F 17/50
(52) U.S. Cl. ................................ 716/4; 716/5; 716/6
(58) Field of Search .......................... 716/1–4, 12–16, 716/8; 714/33, 35, 37, 712, 714; 703/13, 20, 22, 23

(56) References Cited

U.S. PATENT DOCUMENTS

| | | | |
|---|---|---|---|
| 5,517,432 A | | 5/1996 | Chandra et al. |
| 5,604,895 A | | 2/1997 | Raimi |
| 5,680,332 A | | 10/1997 | Raimi et al. |
| 5,774,370 A | | 6/1998 | Giomi |
| 5,896,401 A | * | 4/1999 | Abramovici et al. ........ 714/741 |
| 6,175,946 B1 | | 1/2001 | Ly et al. |
| 6,182,268 B1 | | 1/2001 | McElvain |
| 6,216,252 B1 | * | 4/2001 | Dangelo et al. ............... 716/1 |

OTHER PUBLICATIONS

Narain, et al., "A High–Level Approach to Test Generation," Jul. 1993, pp. 483–492.
Brand, et al., "Incremental Synthesis," 1994, pp. 14–18.
"Time Rover: The Formal Testing Company," Nov. 17, 1997, p. 1.
"Solidification: Static Functional Verification with Solidify," 1999, pp. 1–10.
Solidify: Statis Functional Verification for HDL Designers, Mar. 1999, 2 pages.
"Formalized Design", download from www.formalized.com/prod.html on Jul. 1999, p. 1.
"Specman Elite Data Sheet," downloaded from www.verisity.com on Jul. 1999, pp. 1–2.
0–In Methodology Overview, download from www.0–in.com on Jul. 1999, pp. 1–2.
"Design INSIGHT Formal Model Checker," downloaded from www.chrysalis.com on Jul. 1999, pp. 1–4.
"Design INSIGHT FDRC Formal Design Rule Check Tools," downloaded from www.chrysalis.com in Jul. 1999, pp. 1–3.
"Datasheet: Affirma FormalCheck model checker," 1 page.
"Datasheet: Affirma Coverage Analyzer," 1 page.
"Assertion Compiler: Finds Hidden Bugs In Verilog And VHDL Designs," 1999, 2 pages.
"Sure Thing: The Designer's Workbench," 2 pages.
"Twister: Automatic Model Checker Formal Verification of Designs Using Predefined Rules," 2 pgs.
"0–In Search Data Sheet," pp. 1–3.

(List continued on next page.)

*Primary Examiner*—Vuthe Siek
*Assistant Examiner*—Naum Levin
(74) *Attorney, Agent, or Firm*—Faegre & Benson LLP (57) ABSTRACT

A method and apparatus for characterizing information about design attributes is described. The characterization process may begin with determining the dependency among the attributes within a hardware design. Once the dependency is determined, the most relevant information about the hardware design attribute may be highlighted. A user can then focus their attention on the highlighted aspects of the design attribute to draw conclusions about the hardware design as a whole.

59 Claims, 9 Drawing Sheets

OTHER PUBLICATIONS

"0–In CheckerWare Data Sheet," pp. 1–2.

"0–In Check Data Sheet," pp. 1–3.

"0–In Design Automation Home Page," downloaded from www.0–in.com on May 8, 2000, 1 pg.

"0–In Methodology Overview," downloaded from www.0–in.com on May 8, 2000, 2 pages.

"0–In Check," downloaded from www.0–in.com on May 8, 2000, 2 pages.

"0–In Technical Papers," downloaded from www.0–in.com on May 8, 2000, pp. 1–3.

"0–In Search," downloaded from www.0–in.com on May 8, 2000, pp. 1–2.

Anderson, T., "Using VCS with White–Box Verification Techniques," SNUG San Jose 2000, pp. 1–9.

Switzer, et al., "Functional Verification with Embedded Checkers," 5 pages.

Switzer, et al., "Using Embedded Checkers to Solve Verification Challenges," pp. 1–20.

Goering, Richard, "Verification Start–Up Seeks Design Intent," EE Times, Apr. 24, 2000, 2 pages.

Morrison, Gale, "Shrinking Design Times," Electronic News, May 1, 2000, 3 pages.

Twister (Automated Model Checking) printed from www.verysys.com, 1999, 3 pages.

Intent–Driven Verification, a Whitepaper by Real Intent$_{TM}$, Real Intent, Inc. 9 pages.

Chang, You–Sung, et al., "Verification of a Microprocessor Using Real World Applications," IEEE, Jun. 1999, pp. 181–184.

Goldberg, Evguenii I., et al., "Combinational Verification based on High–Level Functional Specifications," IEEE, Jan. 1998, pp. 1–6.

Van Eijk, C.A.J., et al., "Exploiting Functional Dependencies in Finite State Machine Verification," IEEE, 1996, pp. 9–14.

York, Gary, et al., "An Integrated Environment for HDL Verification," IEEE, 1995, pp. 9–18.

\* cited by examiner

| check 1 | pass |
| check 2 | error |
| check 3 | error |
| | pass |
| | error |
| | • |
| | • |
| | |
| | |
| | • |
| | • |
| | |
| | |
| | • |
| | • |
| | |
| | |
| | • |
| | • |
| | |
| | |
| | • |
| | • |
| | |
| check 1,000,000 | error |

METHOD AND APPARATUS FOR CHARACTERIZING INFORMATION ABOUT DESIGN ATTRIBUTES

FIELD OF THE INVENTION

This invention relates to the field of design verification, more specifically, to an approach for functional verification of digital designs.

BACKGROUND

The object of design verification is to ensure that errors are absent from a design. Deep sub-micron integrated circuit (IC) manufacturing technology is enabling IC designers to put millions of transistors on a single IC. Following Moore's law, design complexity is doubling every 12–18 months, which causes design verification complexity to increase at an exponential rate. Because of their complexity, manual analysis of these IC designs becomes quite cumbersome. In addition, competitive pressures are putting increased demands on reducing time to market. The combination of these forces has caused an ever worsening verification crisis.

Today's design flow starts with a specification for the design. The designer implements the design in a language model, typically Hardware Description Language (HDL). This model is typically verified to discover incorrect input/output (IO) behavior via a stimulus in expected results out paradigm at the top level of the design.

Figure 1:
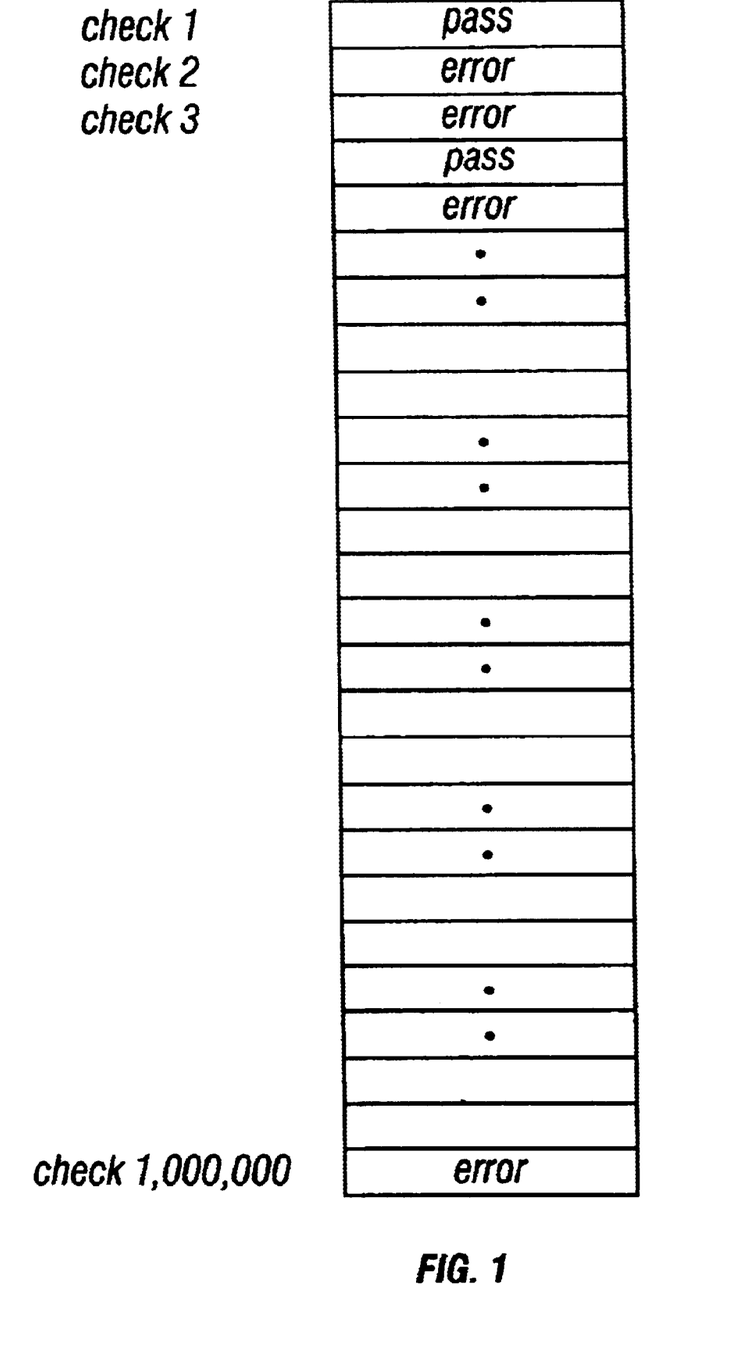
FIG. 1 illustrates a prior art method of design verification error reporting.

By far the most popular method of functional verification today, simulation-based functional verification, is widely used within the digital design industry as a method for finding defects within designs. Products are available in the market to support simulation-based verification methodologies. A wide variety of products provide for a set of design verification checks to allow conclusions to be drawn about the hardware design. The checks may be used to provide error reporting. However, with integrated circuits having millions of transistors, and more, designers are being inundated with error messages in a disorganized fashion that is very time consuming to sort through, as illustrated by FIG. 1.

Another problem with prior products is that they may not provide an exhaustive analysis of a design. Moreover, these products produce large amounts of noise, or data that does not provide meaningful information about the main errors within a design. For example, a check may be dependent upon a set of other checks if it is impossible to violate the first without violating at least one or more checks from the set. Prior checking methods do not consider dependency relationships among the comprehensive set of design verification checks to be determined. As such, redundant failures due to multiple violations resulting from a common design error may be reported. In this manner, verification of design errors is made more inefficient because designers are inundated with redundant and cumulative information.

SUMMARY OF THE INVENTION

The present invention pertains to a method and apparatus for characterizing information about a design attribute. In one embodiment, the method may include determining a relationship between attributes of hardware design and performing an analysis for the existence of a violation of the attributes. The method may also include reporting the results of the analysis based on the relationship.

In one embodiment, the information may be characterized by determining dependency relationships among the attributes, with each of the attributes representing a condition that, if violated, indicates that the design does not operate correctly. In one particular embodiment, an attribute may represent a condition that must hold true in order for the hardware design to operate in accordance with an intended flow of logical signals in the hardware design.

In one embodiment, the reporting may include identifying the violations of the plurality of attributes with a particular priority such as a primary and a secondary violation. The reporting may also include presenting only the primary violations. In an alternative embodiment, both the primary and the secondary violations may be presented with the primary violations being more prominently presented.

Additional features and advantages of the present invention will be apparent from the accompanying drawings and from the detailed description that follows.

BRIEF DESCRIPTION OF THE DRAWINGS

The present invention is illustrated by way of example, and not by way of limitation, in the figures of the accompanying drawings and in which.

DETAILED DESCRIPTION

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps, which will be described below. The steps of the present invention may be performed by hardware components or may be embodied in machine-executable instructions, which may be used to cause a general-purpose or special-purpose processor programmed with the instructions to perform the steps. Alternatively, the steps may be performed by a combination of hardware and software.

The present invention may be provided as a computer program product that may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPOMs, magnetic or optical cards, flash memory, or other type of media/machine-readable medium suitable for storing electronic instructions.

Moreover, the present invention may also be downloaded as a computer program product, wherein the program may be transferred from a remote computer to a requesting computer by way of data signals embodied in a carrier wave or other propagation medium via a communication link (e.g., a modem or network connection).

For convenience, embodiments of the present invention will be described with reference to Verilog and VHDL. However, the present invention is not limited to any particular representation of a hardware design. For example, the language representation of a hardware design may be in the C programming language, C++, derivatives of C and/or C++, or other high-level languages.

In addition, while embodiments of the present invention are described with reference to functional verification of hardware designs, aspects of the present invention are equally applicable to other types of design activities as well, such as hardware synthesis, design optimization, design simulation and performance analysis. Furthermore, while embodiments of the present invention are described with reference to the provision of augmented design information by way of hardware description language (HDL) annotations, it is contemplated that the augmented design information could reside in a file separate from the file containing the HDL. Alternatively, a new HDL could be developed having semantics capable of capturing the augmented design information.

Terminology

Before describing an illustrative design verification environment in which various embodiments of the present invention may be implemented, brief definitions of terms used throughout this application are given below.

An "attribute" is defined as a desired characteristic of a design such as a property, signal flow relationship, or temporal relationship among signals in a design. An attribute represents a condition that must hold true in order for the design to operate in accordance with its intended operation. Specific examples of attributes include a proper timing characteristic, proper signal toggling, and the absence of a bus contention. An existence of an attribute may be an indication of a success of a design. A violation, or non-existence, of an attribute may be an indication of an error in the design.

A "design" is defined as a description of a collection of objects, such as modules, blocks, wires, registers, etc. that represent a logic circuit.

A design may be expressed in the form of a language. For example, a hardware description language (HDL), such as Verilog or VHDL can be used to describe the behavior of hardware as well as its implementation.

As used herein an "annotation" refers to text embedded in a language construct, such as a comment statement or remark. Most programming languages have a syntax for creating comments thereby allowing tools designed to read and/or process the programming language to read and ignore the comments.

"Simulation" is generally the process of evaluating design behavior for a set of input conditions to draw approximate conclusions about the behavior of many different attributes of the design.

"Formal analysis" generally refers to the process of analyzing a design for all possible input conditions to derive definite conclusions about the behavior of an attribute with respect to the design.

"Functional verification" generally refers to the process of applying stimuli to a design under test with appropriate checking mechanisms to either detect a defect in the design or to establish that the functionality performs as expected. Typically, the three key components of a functional verification process are the applied stimulus, the checking mechanism, and the user's ability to both run the process and debug the results. As will be described later, the effectiveness of a functional verification process may be measured in terms of the following three metrics: (1) error coverage, (2) stimulus coverage, and (3) usability.

The term "design intent" generally refers to what the designer intends in terms of the interaction between components of the design and the designer's expectations regarding acceptable functional behavior. For example, the designer may intend a particular flow of logical signals among the variables of an RTL design description (the intended flow). Traditionally, design intent has referred to input constraints, internal constraints, and/or cause and effect modeling. In contrast, as used herein the term "design intent" includes "implied design intent" and additional forms of "expressed design intent."

"Expressed design intent" generally refers to design intent explicity conveyed by a designer by way of intent modeling semantics in a control file or embedded within annotations of RTL source code (the hardware design representation), for example. Examples of expressed design intent regarding the intended flow of logical signals may include the intended temporal behaviors (e.g., the ACK signal must go high within 4 cycles of the REQ signal) and the intended data flow relationships (e.g., the data being loaded from the input port is the data intended for transfer by the driver of the input port). "Implied design intent" generally refers to design intent that is inferred from the design description including expected behaviors that should occur within standard design practices.

A "Sentry verification entity" or "verification entity" generally refers to an object that may be embedded within a hardware design to facilitate the modeling of design intent. As described further below, Sentry verification entities provide a mechanism by which state information can be associated with variables in a representation of a hardware design. According to various embodiments of the present invention, Sentry verification entities may be used to verify a design by allowing design intent (both expressed and implied) to be checked against what the design actually accomplishes.

A "property" is a condition or statement, typically expressed in terms of a relationship among a group of one or more signals in a hardware design, that must hold for the hardware design to function as intended. According to one embodiment, violations are reported at the property-level rather than at the more detailed level of design verification checks.

The term "design verification check" or simply "check" generally refers to a mechanism for verifying a property. Properties may be composed of one or more checks, which are the atomic units that are verified. That is, properties may be broken down into one or more checks. Since properties and checks are sometimes equivalent (i.e., when a property comprises a single design verification check), these terms may at times be used interchangeably.

Examples of checks include, but are not limited to: monitors, Boolean conditions, sensitized path conditions, and the like. According to one embodiment, a comprehensive set of checks may be automatically formulated based upon a representation of the hardware design and information regarding the intended flow of logical signals among a plurality of variables in the representation.

Check A is said to be "dependent" upon checks B, C, and D if it is impossible to violate check A without violating at least one of checks B, C, and D. If check A is dependent upon check B, C and D, then a "dependency relationship" exists between check A and checks B, C, and D.

An Exemplary Intent-Driven Verification System

Figure 2:
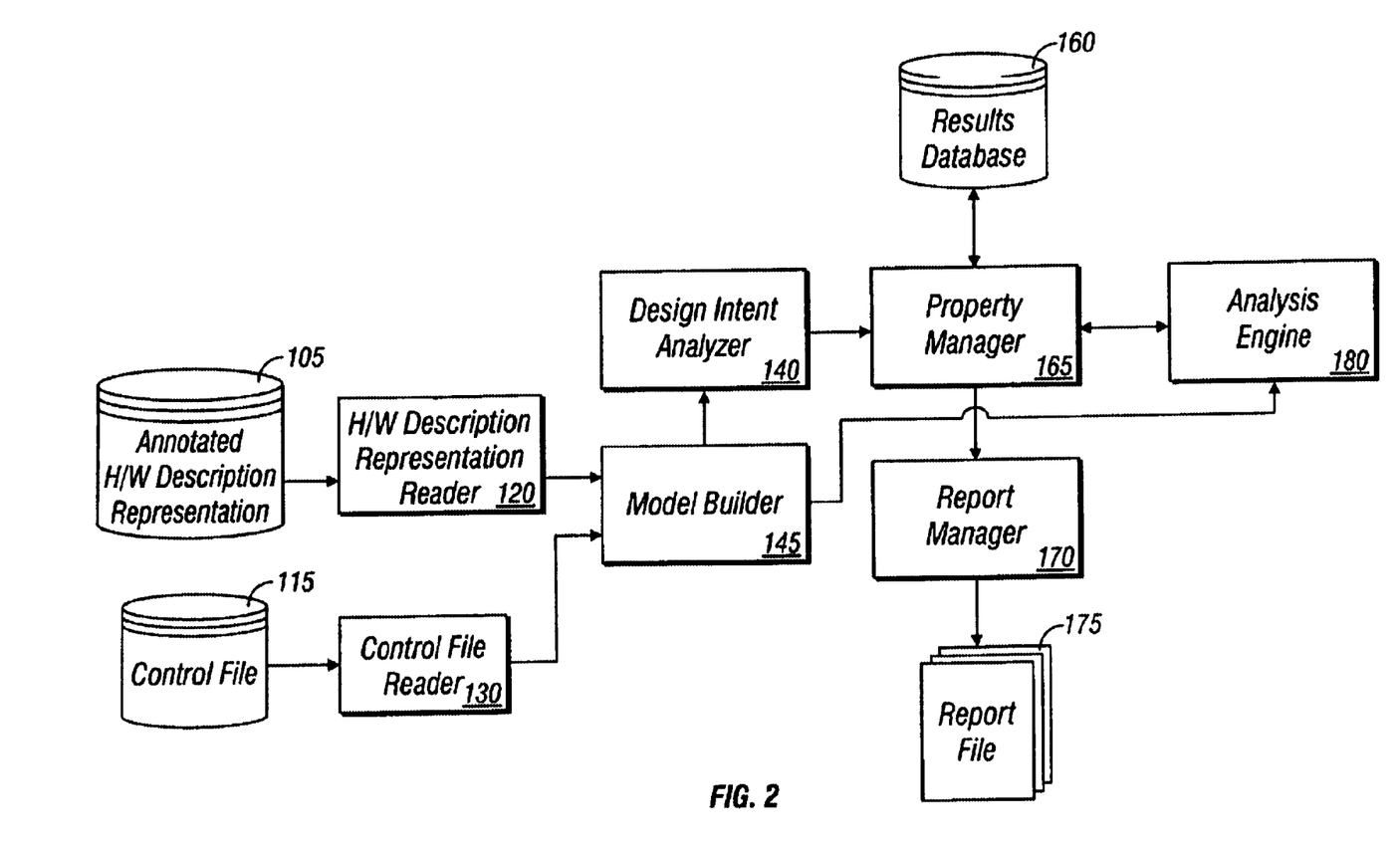
FIG. 2 is a block diagram illustrating an exemplary architecture of an Intent-Driven Verification (IDV) system according to one embodiment of the present invention.

FIG. 2 is a block diagram illustrating an exemplary architecture of an Intent-Driven Verification (IDV) system according to one embodiment of the present invention. IDV identifies the "intent gap" between what a designer intends to build (design intent) and what has actually been created within the language representation of the hardware design (design implementation), such as RTL source code. By augmenting the RTL source code or associated control file with information indicative of the designer's intent, a comprehensive set of checks can be automatically formulated and verified.

According to the embodiment depicted, the IDV system 100 includes an annotated hardware design representation reader 120. The annotated hardware design representation reader 120 may be a conventional RTL reader with the additional ability to recognize and process augmented design information. Alternatively, the annotated hardware design representation reader 120 may be a conventional C or C++ parser capable of processing the augmented design information. In one embodiment, the augmented design information comprises annotations embedded within the hardware design representation 105, such as an annotated RTL source code file 105 containing special verification semantics (directives). Exemplary directives and their syntax are described further below. In alternative embodiments, the augmented design information may be included in a control file associated with the hardware design representation 105, such as control file 115.

The IDV system 100 also includes a control file reader 130. The control file reader 130 may be a conventional control file reader. Alternatively, in the case that the augmented design information (e.g., information regarding design intent, such as the intended flow of logical signal among variables in the hardware design representation) is to be provided by way of control file 115, then the control file reader 130 additionally includes parsing functionality enabling the control file reader 130 to recognize and process the augmented design information.

According to the architecture depicted, the IDV system 100 also includes a model builder 145, a design intent analyzer 140, a property manager 165, an analysis engine 180, and a report manager 170. The model builder 145 receives output of the hardware design representation reader 120, the control file reader 130, and a cell library (not shown) and builds an internal representation of the hardware design, a model. Additionally, based upon the designer's expressed design intent and/or implied intent, the model builder embeds special verification entities into the model for the purpose of identifying the intent gap between what the designer intended to build (design intent) and what has actually been created within the source code (design implementation). These special embedded objects are referred to as Sentry verification entities. Details regarding the use, functionality, and implementation of Sentry verification entities are presented below.

The design intent analyzer 140 automatically produces a comprehensive set of attributes such as design verification checks, for example, behavioral integrity checks and temporal integrity checks. The design verification checks are based upon a predetermined set of properties and the Sentry verification entities. For example, for each Sentry verification entity in the model, the design intent analyzer 140 may automatically create checks to verify that there is no access of invalid data by the Sentry verification entity and the no active data from the Sentry verification entity is lost. Other properties and verification of these properties, in terms of checks and Sentry verification entities, are discussed below.

Consequently, by merely associating the Sentry attribute with a variable in an RTL representation of the hardware design and providing minimal additional information regarding the desired/expected interaction between components of the design and regarding expectations for acceptable functional behavior, the design intent analyzer 140 enables verification while the design is being developed and facilitates detection of design defects at the RTL-level.

Advantageously, in this manner, the designer is not required to manually code individual monitors for each property he/she would like to verify. Rather, verification cycle time and resource requirements are reduces by allowing the designer to simply associate the Sentry attribute with certain important variables, sentinel variables (e.g., by "declaring" the sentinel variables as Sentry verification entities), provide minimal additional information regarding the desired/expected interaction between components of the design (such as an indication regarding the expected state of the sentinel variables at various points in the control flow structure of a finite state machine associated with the hardware design representation), and the generation of a complete set of checks involving the sentinel variables is automatically performed. Importantly, the use of Sentry verification entities to enable automatic formulation of a comprehensive set of design verification checks not only dramatically reduces verification effort and time but also significantly increases design robustness.

The property manager 165 maintains information regarding relationships among the checks generated by the design intent analyzer and additionally maintains information regarding relationships among properties and whether the properties are satisfied, violated, or whether the results are indeterminate or conditional upon one or more other properties. According to one embodiment, the property manger 165 and analysis engine 180 cooperate to determine dependency relationships among the comprehensive set of design verification checks. As described further below, the dependency relationships (or "linking" information) may be used to facilitate error reporting or used to streamline check processing.

The analysis engine 180 verifies the model produced by the model builder by testing for violations of the properties. Preferably, the analysis engine 180 employs an analysis-based technique, such as an integration of simulation and formal analysis methodologies, so as to maximize stimulus coverage for the design under test. However, in alternative embodiments, simulation, functional verification, or other well-known verification methodologies may be employed individually.

The report manager 170 provides feedback to the designer, in the form of a report file 175, for example, regarding potential design defects. It should be noted that a single error in the hardware design might lead to a violation of 25 to 30 or more different design verification checks. There is no point in reporting every violation if the user has already been notified that an error exists.

Therefore, according to one embodiment, an intent violation hierarchy may be maintained when reporting design defects. In this manner, redundancy of reported information is contained. Multiple intent violations due to a common defect are not reported. As such, a dependency relationship between the violations may be determined and those design verification checks that are already known to be dependent upon the received design verification check may be disabled.

Figure 8:
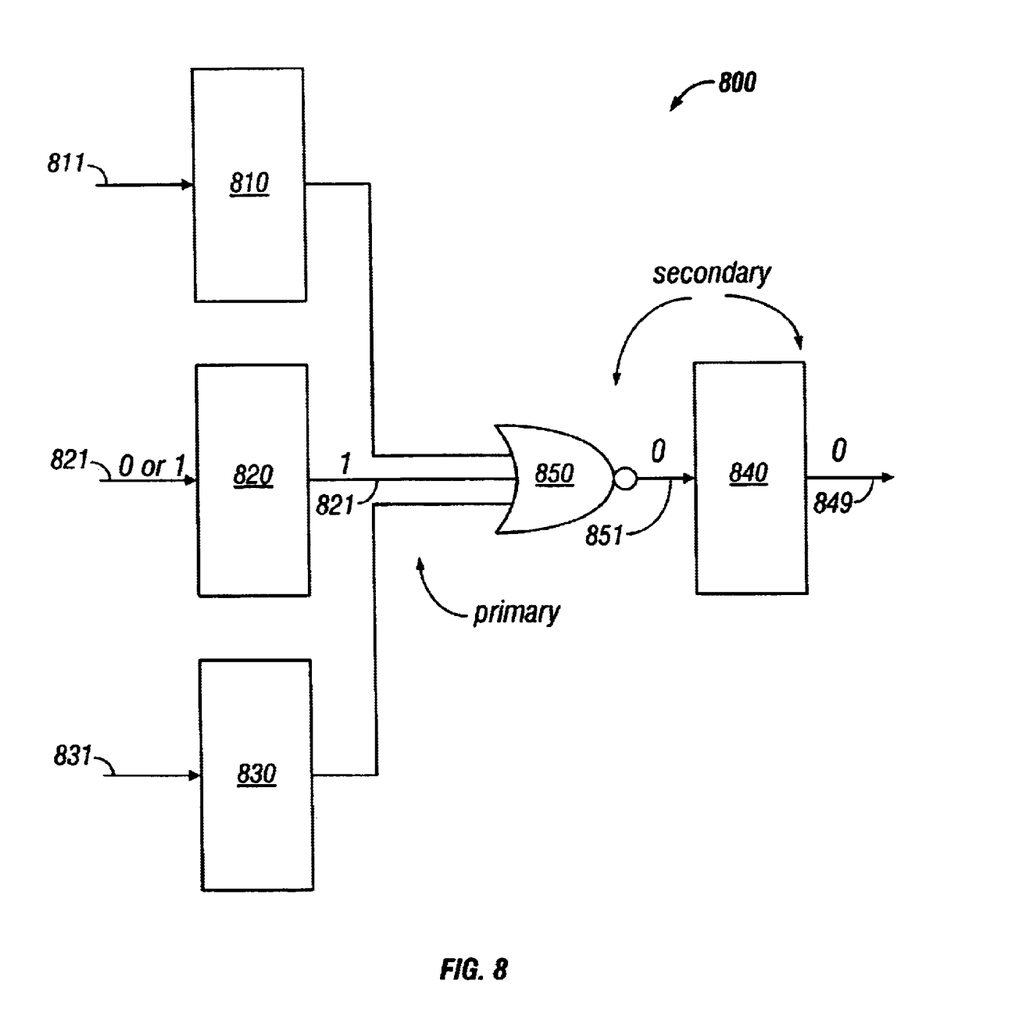
FIG. 8 illustrates an example of a specific attribute dependency.

FIG. 8 illustrates an example of a specific attribute dependency. Where an attribute is, for example, an error in an IC design that causes a failure in signal toggling, a dependency between attributes may be the output signal toggle of one circuit block in relation to the input signal toggle of other circuit blocks coupled to it.

Circuit 800 represents an exemplary portion of an IC design. Design intent analyzer 140 of FIG. 2 may be used to produce a set of design verification checks to evaluate the behavioral integrity of circuit 800. Circuit 800 includes four flops 810–840 and NOR gate 850. For circuit 800 to properly function the output of flop 840 should toggle between a "0" and a "1" state depending on the toggling of inputs to flops 810–830. Design verification checks may be run to verify the functional integrity of circuit 800 by toggling the inputs to flops 810-830 and monitoring the output 849 of flop 840. If flop 820 is not operating properly such that its output 821 is stuck at a "1" then the output of gate 850 and, correspondingly, the output 849 of flop 840 will be stuck at a "0" because of the logic configuration of circuit 800. Regardless of the value of inputs 811 and 831 to flops 810 and 830, respectively, output 849 remains at a "0."

Therefore, it may be unnecessary to report a failure for gate 850 and flop 840 as their outputs 851 and 849, respectively, are dependent upon the non-functionality of flop 820. Thus, property manager 165 of FIG. 2 may be used to determine such a dependency relationship and report manager 170 of FIG. 2 may be used to report only a single failure. Continuing the example of FIG. 8, the failure of flop 820 may be designated, and reported as, a primary failure. Whereas, the failure of gate 850 and flop 840 may be designated as secondary failures. By determining dependencies and eliminating multiple reports due to a common defect, the amount of data to be analyzed due to detected defects may be minimized.

Figure 3:
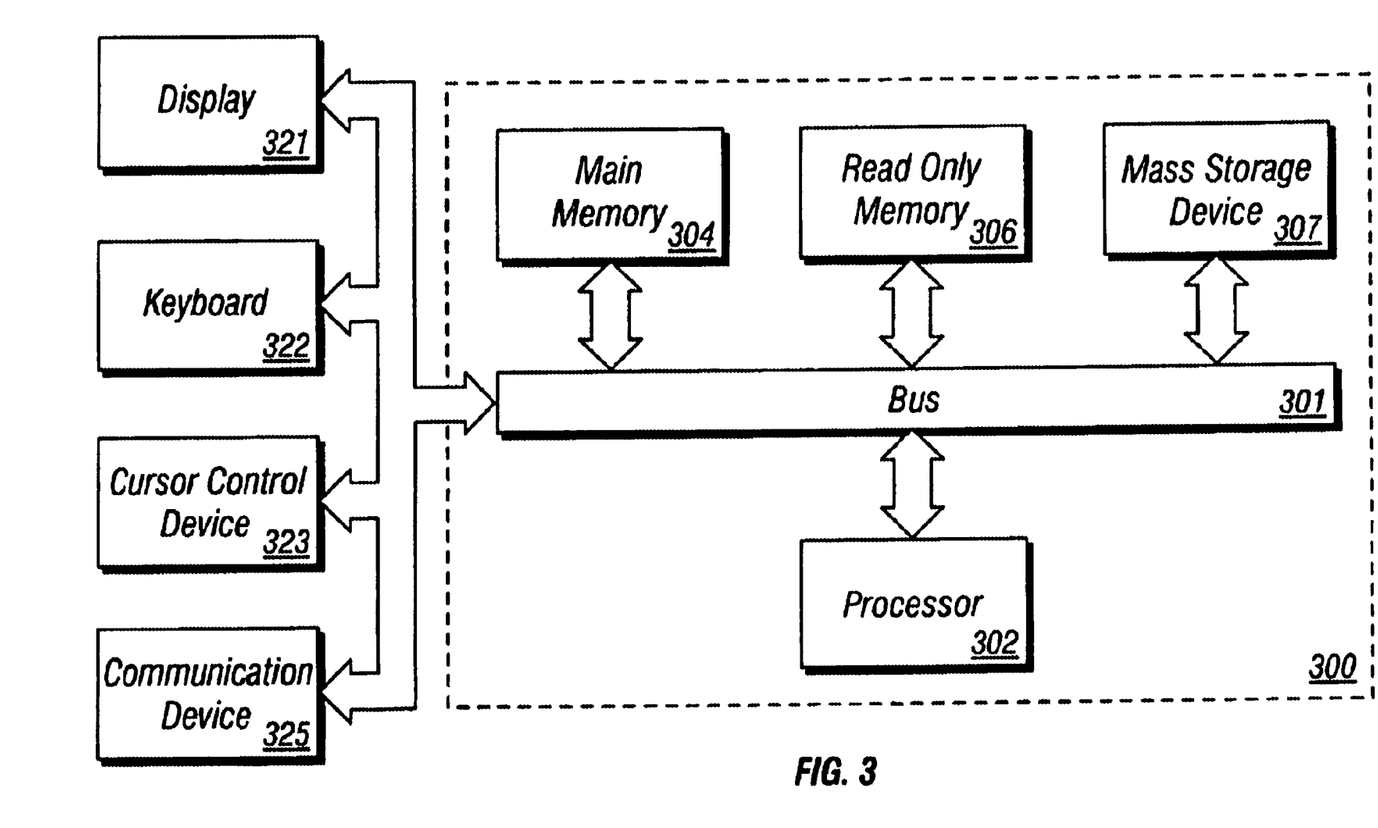
FIG. 3 is an example of a computer system upon which one embodiment of the present invention may be implemented.

FIG. 3 illustrates an exemplary machine in the form of a computer system 300 representing an exemplary workstation, host, or server in which features of the present invention may be implemented.

Computer system 300 includes a bus or other communication means 301 for communicating information, and a processing means such as processor 302 coupled with bus 301 for processing information. Computer system 300 further includes a random access memory (RAM) or other dynamic storage device 304 (referred to as main memory), coupled to bus 301 for storing information and instructions to be executed by processor 302. Main memory 304 also may be used for storing temporary variables or other intermediate information during execution of instructions by processor 302. Computer system 300 also includes a read only memory (ROM) and/or other static storage device 306 coupled to bus 301 for storing static information and instructions for processor 302.

A data storage device 307 such as a magnetic disk or optical disc and its corresponding drive may also be coupled to computer system 300 for storing information and instructions. The data storage device 307 may be used to store instructions for performing the steps discussed herein. Processor 302 may be configured to execute the instructions for performing the steps discussed herein.

Computer system 300 can also be coupled via bus 301 to a display device 321, such as a cathode ray tube (CRT) or Liquid Crystal Display (LCD), for displaying information to an end user. For example, graphical and/or textual depictions/indications of design errors, and other data types and information may be presented to the end user on the display device 321. Typically, an alphanumeric input device 322, including alphanumeric and other keys, may be coupled to bus 301 for communicating information and/or command selections to processor 302. Another type of user input device is cursor control 323, such as a mouse, a trackball, or cursor direction keys for communicating direction information and command selections to processor 302 and for controlling cursor movement on display 321.

A communication device 325 is also coupled to bus 301. Depending upon the particular design environment implementation, the communication device 325 may include a modem, a network interface card, or other well-known interface devices, such as those used for coupling to Ethernet, token ring, or other types of physical attachment for purposes of providing a communication link to support a local or wide area network, for example. In any event, in this manner, the computer system 300 may be coupled to a number of clients and/or servers via a conventional network infrastructure, such as a company's Intranet and/or the Internet, for example.

Referring back to FIG. 2, the property manager 165 may track information regarding relationships among the various attributes determined by the design intent analyzer 140. In addition, property manager 165 may also perform an analysis for the existence or the non-existence of attributes. The report manager 170, receives this information from property manager 165 and reports the results of the analysis based on the relationships. The reports may include categorization of the attributes into primary and secondary failures and ranking based on a priority for different types of failures.

Figure 4A:
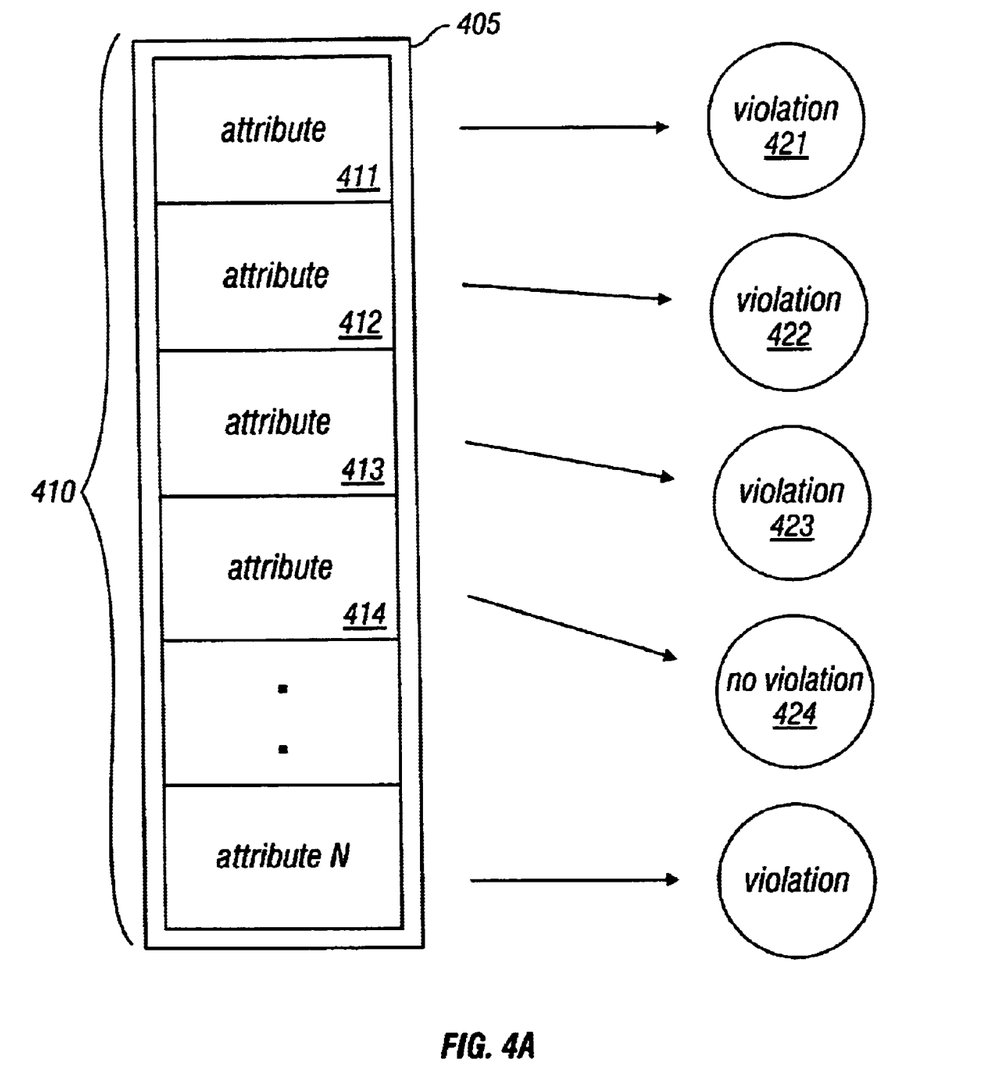
FIG. 4A is a conceptual illustration of one embodiment of attribute processing.

FIG. 4A is a conceptual illustration of one embodiment of attribute processing. Multiple attributes 410 may be analyzed for the design intent of a hardware design. The attributes 410 may be analyzed to determine if they exist or if they result in a violation. For example, attributes 411–413 may be determined to have a violation while attribute 414 may be determined to have no violation. In one embodiment, the attributes may be analyzed for their dependencies 405 prior to the analysis to determine their existence. The attributes may be analyzed for their dependency on other attributes using, for example, linking processing as discussed below in relation to FIGS. 6 and 7.

Figure 4B:
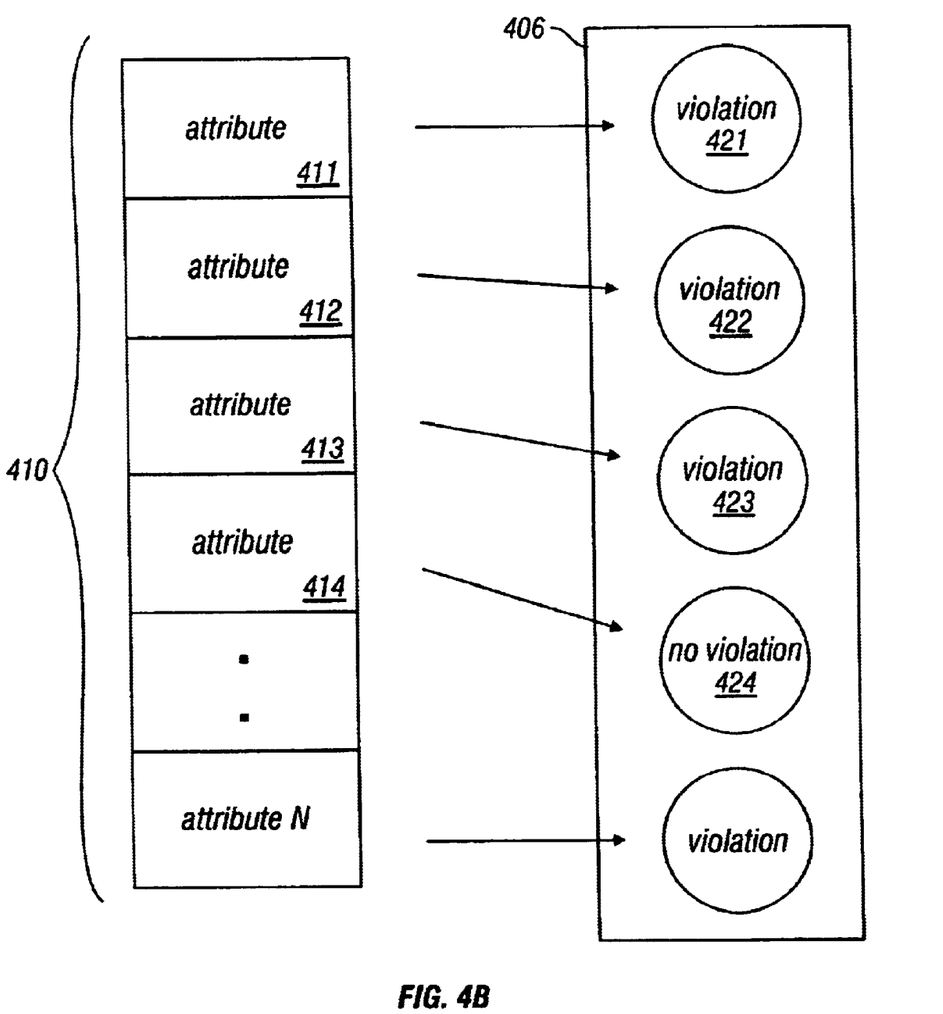
FIG. 4B is a conceptual illustration of an alternative embodiment of attribute processing.

FIG. 4B is a conceptual illustration of an alternative embodiment of attribute processing. In an alternative embodiment, post processing of the dependencies may be performed where the attributes are first analyzed to determine their existence or violation. The attributes may then be analyzed for their dependencies 406. For example, attributes 410 may be first analyzed to determine their existence or violation. Based on the dependency analysis, for example, attribute violation 421 may be determined to have a dependency on attribute violation 422.

Figure 4C:
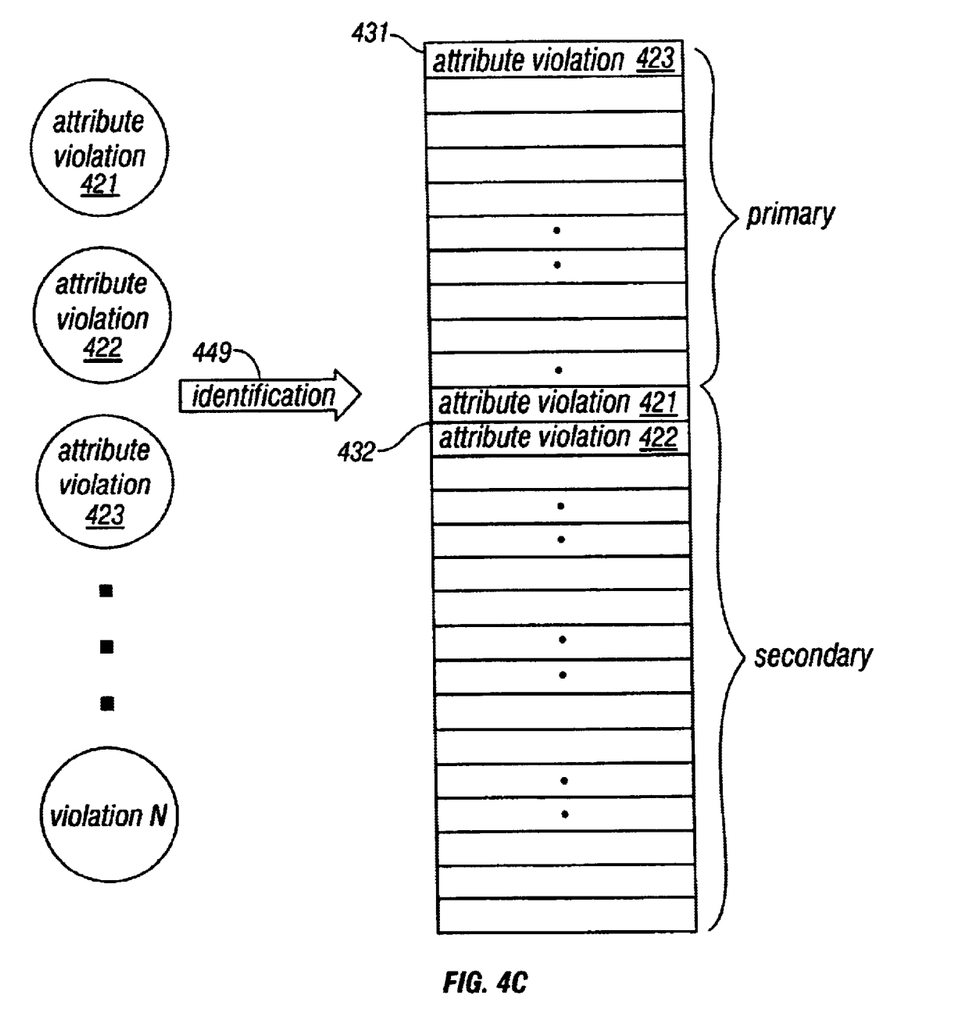
FIG. 4C illustrates one embodiment of attribute reporting.

Once the attributes are analyzed and their dependencies determined through either pre or post processing, the attributes may be identified with a particular priority and reported, as illustrated in FIG. 4C. Each attribute may be designated as either a primary or a secondary violation through an identification process 449. A secondary violation may be a failure of one check that is not possible to achieve without also failing another check. A primary violation may be a failure of one check that may occur without failing another check.

Alternatively, a primary violation may be a selected failure, among a group of failures with circular dependencies, using a predetermined criteria. For example, four attributes A, B, C, and D may be evaluated for their dependencies. If attributes A, B, C, and D have a circular dependency, then attribute B may depend on attribute A, attribute C may depend on attribute B, attribute D may depend on attribute C, and attribute A may depend on attribute D. In one embodiment, when attribute B is determined to have a dependency on attribute A, then attribute A may be disabled from the possibility of having a dependency and a violation of attribute A may be designated as a primary violation. It should be noted that the reporting of violations is not limited to the format illustrated in FIG. 4C. In an alternative embodiment, for example, each primary violation may be reported in combination with its dependent secondary violations.

In this manner, the attribute violations may be prioritized based on their type. For example, attribute violations 421 and 422 may be determined to be secondary violations 432 because of their attribute dependencies on other attributes. Attribute violation 423 may be determined to be a primary violation 431 because of its lack of dependency on other attributes or its selection as such. In one embodiment, only the primary violations may be reported to the user. In another embodiment, both the primary and secondary violations may be reported to the user with the primary violations being reported more prominently.

As such, the output of report manager 170 of FIG. 2 provides priority results that may be based on the relationships between the attributes. This allows a designer to process enormous amounts of information for a complex design in order to obtain relevant and desired information about some design attributes. By appropriately categorizing all the information generated by design intent analyzer 140 of FIG. 2, a user can focus his attention on relevant parts of the information more readily.

Figure 5:
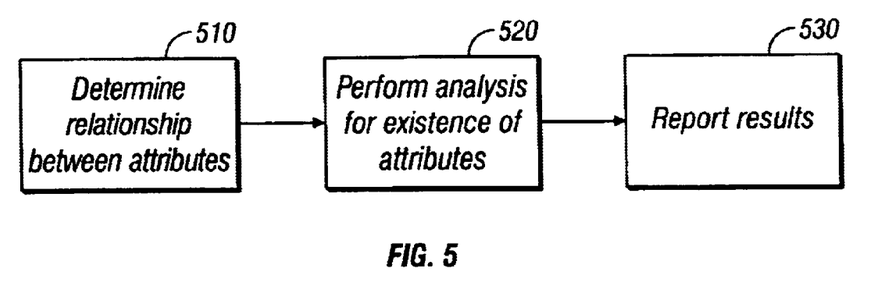
FIG. 5 illustrates one embodiment of a method of characterizing a hardware design.

FIG. 5 illustrates one embodiment of a method of characterizing a hardware design. In one embodiment, design intent analyzer 140 of FIG. 2 may be used to determine a relationship between attributes (e.g., checks) of the hardware design, step 510. After the relationship is determined, an analysis may be performed for the existence or the non-existence of the certain attributes, step 520. Then, the results of the analysis may be reported by report manager 170 of FIG. 2 based on the relationship between the attributes, step 530. For example, the attributes may be identified based on their relationship with other attributes and correspondingly assigned a priority, for example, as a primary or secondary failure. In this manner, a designer may use knowledge of dependency relationship to provide efficiencies in the reporting process.

As previously mentioned, the relationships could be determined through a linking process. The dependency relationships (or "linking" information) may be used to facilitate error reporting or used to streamline check verification processing.

Figure 6:
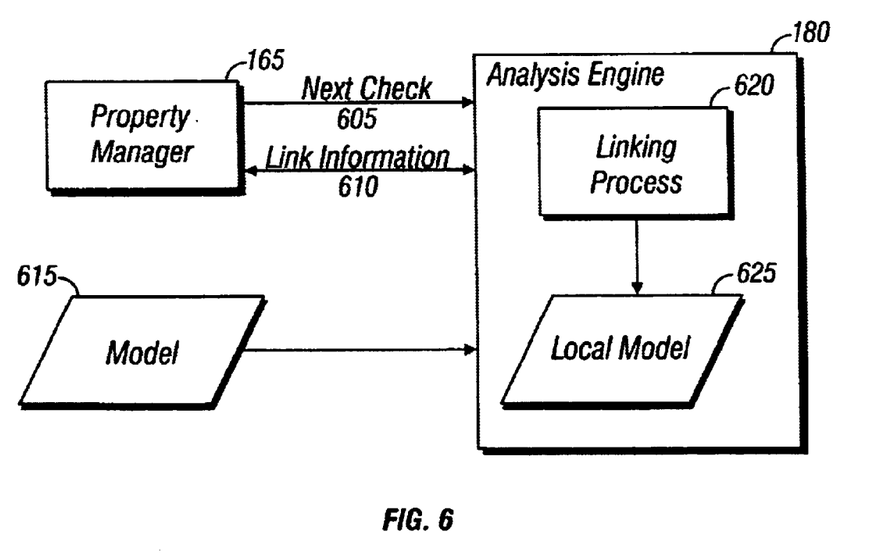
FIG. 6 is a block diagram that illustrates one embodiment of linking processing.

FIG. 6 is a block diagram that illustrates one embodiment of linking processing. According to this example, link processing involves both the property manager 165 and the analysis engine 180. The property manager 165 provides the next check 605 to be processed to the analysis engine 180; and the analysis engine 180 returns link information 610, such as whether or not the currently processed check is dependent upon another check and if so, which check. The analysis engine 180 includes a linking process 620 and a local model 625. The local model 625 is initialized with a copy of the model 615 generated by the model builder. However, during link processing, the local model is modified to disable various checks.

Figure 7:
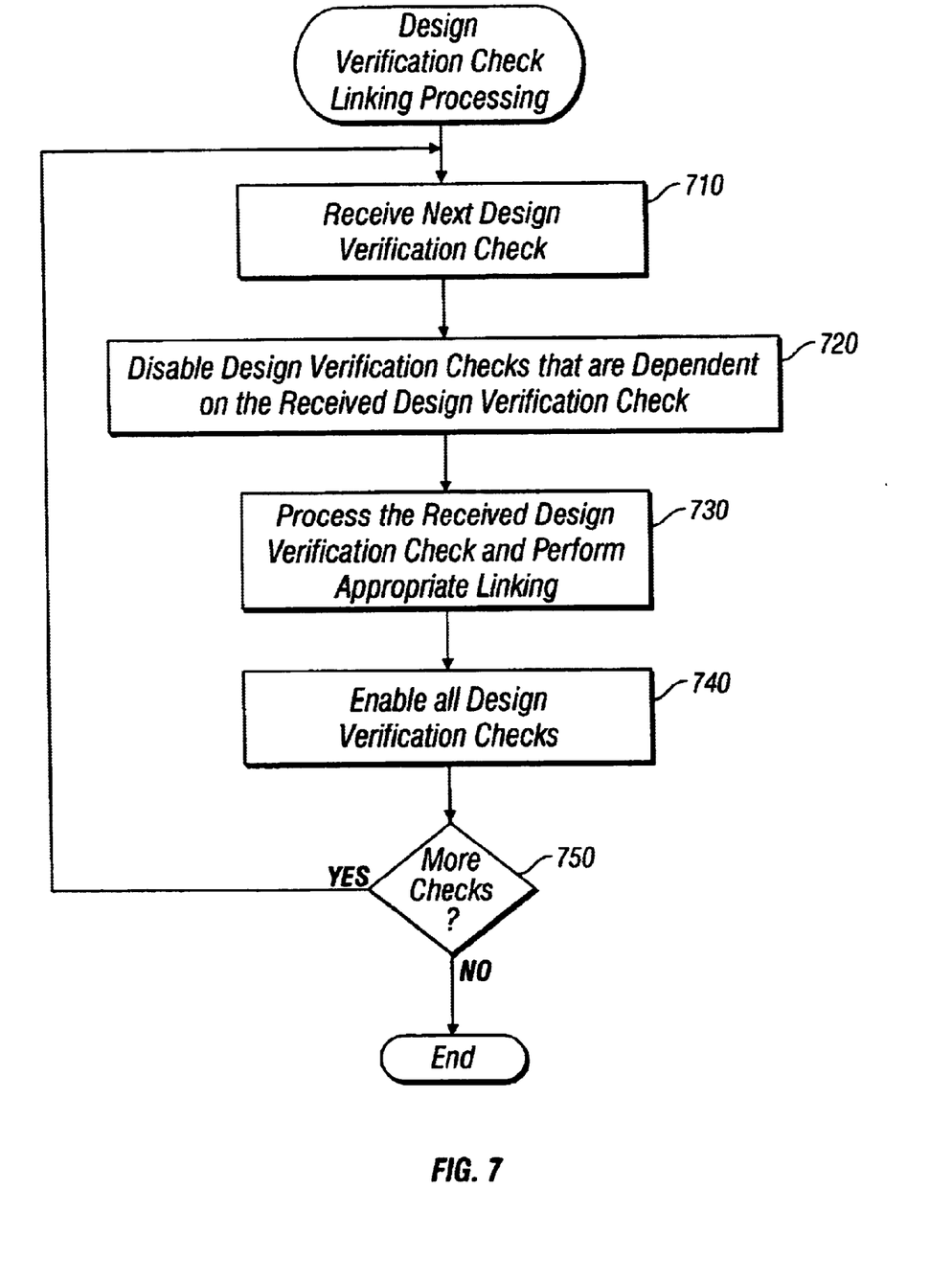
FIG. 7 is a high-level flow diagram that illustrates another embodiment of linking processing.

FIG. 7 is a high-level flow diagram that illustrates another embodiment of linking processing. At processing block 710, the next design verification check is received by the analysis engine 180 from the property manager 165. In order to avoid circular dependency relationships, those design verification checks that are already known to be dependent upon the received design verification check are disabled in the local model 725 at processing block 720. The received design verification check is evaluated at processing block 730 and appropriate linking is also performed. Then, at processing block 740, all of the design verification checks are enabled in anticipation of further check processing. Finally, at decision block 750, a determination is made whether or not there are more checks to be processed. If so, control flow returns to processing block 710. Otherwise, link processing is complete.

It should be noted that although the above dependencies have been described in relation to the functional integrity of a design, in alternative embodiments, other attributes and dependencies of a design may be examined, for example, the timing analysis of a design.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:

determining information regarding relationships among a plurality of verification attributes of a hardware design, wherein said determining information regarding relationships comprises determining dependency relationships among the plurality of verification attributes, each of the plurality of verification attributes representing a condition that must hold true in order for the hardware design to operate correctly in accordance with intended behavior of logical signals in the hardware design;

determining whether a violation of one or more of the plurality of verification attributes can occur by performing a verification process on a language representation of the hardware design; and reporting results of the verification process based on the information regarding relationships among the plurality of verification attributes.

2. The method of claim 1, wherein each of the plurality of verification attributes represents a condition that must hold true in order for the hardware design to operate in accordance with an intended flow of logical signals in the hardware design.

3. The method of claim 1, wherein the verification process is performed after said determining information regarding relationships among a plurality of verification attributes.

4. The method of claim 1, wherein said reporting results of the verification process comprises:

associating a priority with each violation of the plurality of verification attributes; and presenting the violations based upon their respective priorities.

5. The method of claim 4, further comprising determining whether each of the violations is a primary violation or secondary violation, primary violations representing violations of an independent verification attribute of the plurality of verification attributes that is independent of other verification attributes of the plurality of verification attributes and secondary violations representing violations of a dependent verification attribute of the plurality of verification attributes that is dependent upon one or more other verification attributes of the plurality of verification attributes.

6. The method of claim 5, wherein only the primary violations are presented.

7. The method of claim 5, further comprising presenting the secondary violations, the primary violations being more prominently presented than the secondary violations.

8. The method of claim 4, wherein one of the plurality of verification attributes comprises proper signal toggling.

9. The method of claim 4, wherein said determining information regarding relationships among a plurality of verification attributes comprises linking a plurality of design verification checks associated with the hardware design by determining dependency relationships among the plurality of design verification checks.

10. The method of claim 1, wherein the plurality of verification attributes each comprise one or more design verification checks.

11. The method of claim 1, wherein one or more of the plurality of verification attributes are based on temporal integrity of the hardware design.

12. The method of claim 1, further comprising using the dependency relationships to facilitate reporting.

13. The method of claim 1, wherein the hardware design is expressed in a hardware description language (HDL), and wherein information regarding the intended behavior of the logical signals is captured from semantics of the HDL.

14. The method of claim 1, wherein said determining dependency relationships among the plurality of verification attributes includes for each verification attribute of the plurality of verification attributes:

disabling, in an internal representation of the hardware design, those of the other plurality of verification attributes that are dependent on the verification attribute, evaluating the verification attribute with reference to the internal representation of the hardware design, and enabling all of the plurality of verification attributes in the internal representation of the hardware design in anticipation of subsequent dependency relationship analysis.

15. A method comprising:

determining information regarding relationships among a plurality of verification attributes of a hardware design, each of the plurality of verification attributes representing a condition that must hold true in order for the hardware design to operate correctly;

determining whether a violation of one or more of the plurality of verification attributes can occur by performing a verification process on a language representation of the hardware design;

determining whether each of the violations is a primary violation or secondary violation, primary violations representing violations of an independent verification attribute of the plurality of verification attributes that is independent of other verification attributes of the plurality of verification attributes and secondary violations representing violations of a dependent verification attribute of the plurality of verification attributes that is dependent upon one or more other verification attributes of the plurality of verification attributes; and reporting results of the verification process based on the information regarding relationships among the plurality of verification attributes, wherein said reporting results of the verification process comprises:

associating a priority with each violation of the plurality of verification attributes; and presenting the primary violations and the secondary violations based upon their respective priorities, wherein the primary violations are more prominently presented than the secondary violations.

16. The method of claim 15, wherein each of the plurality of verification attributes represents a condition that must hold true in order for the hardware design to operate in accordance with an intended flow of logical signals in the hardware design.

17. The method of claim 15, wherein the verification process is performed after said determining information regarding relationships among a plurality of verification attributes.

18. The method of claim 15, wherein one of the plurality of verification attributes comprises proper signal toggling.

19. The method of claim 15, wherein said determining information regarding relationships among a plurality of verification attributes comprises linking a plurality of design verification checks associated with the hardware design by determining dependency relationships among the plurality of design verification checks.

20. The method of claim 15, wherein the plurality of verification attributes each comprise one or more design verification checks.

21. The method of claim 15, wherein one or more of the plurality of verification attributes are based on temporal integrity of the hardware design.

22. The method of claim 15, wherein each of the plurality of verification attributes represents a condition that must hold true in order for the hardware design to operate in accordance with intended behavior of logical signals in the hardware design.

23. The method of claim 22, wherein the hardware design is expressed in a hardware description language (HDL), and wherein information regarding the intended behavior of the logical signals is captured from semantics of the HDL.

24. An apparatus, comprising:

a storage device having stored therein one or more routines for determining information regarding relationships among a plurality of verification attributes of a hardware design, each of the plurality of verification attributes representing a condition that must hold true in order for the hardware design to operate correctly in accordance with intended behavior of logical signals in the hardware design; and a processor coupled to the storage device for executing the one or more routines to perform a verification process on a language representation of the hardware design and report results of the verification process based on the information regarding relationships among the plurality of verification attributes.

25. The apparatus of claim 24, wherein the plurality of verification attributes are each represented by one or more design verification checks and the information regarding relationships is determined by determining if any of the design verification checks can be violated during operation of circuitry represented by the hardware design.

26. The apparatus of claim 24, wherein the processor is configured to associate a priority with one or more of the plurality of verification attributes.

27. The apparatus of claim 24, wherein the processor is configured to determine whether a violation of one of the plurality of verification attributes is a primary violation or secondary violation, primary violations representing violations of an independent verification attribute of the plurality of verification attributes that is independent of other verification attributes of the plurality of verification attributes and secondary violations representing violations of a dependent verification attribute of the plurality of verification attributes that is dependent upon one or more other verification attributes of the plurality of verification attributes.

28. The apparatus of claim 27, wherein only the primary violations are reported.

29. The apparatus of claim 27, wherein one or more of the plurality of verification attributes relate to proper signal toggling.

30. The apparatus of claim 24, wherein the hardware design is expressed in a hardware description language (HDL), and wherein information regarding the intended behavior of the logical signals is captured from semantics of the HDL.

31. A method comprising:
receiving a language representation of a hardware design;
linking a plurality of desired characteristics of the hardware design by determining dependency relationships among the plurality of desired characteristics, each of the plurality of desired characteristics representing a condition that (a) must hold true in order for the hardware design to operate in accordance with its intended operation, and (b) must hold true in order for the hardware design to operate in accordance with intended behavior of logical signals in the hardware design;
determining whether the hardware design contains one or more errors by identifying one or more situations in which a violation of one or more of the plurality of desired characteristics can occur, said determining whether the hardware design contains one or more errors avoiding verification of one or more of the plurality of desired characteristics based at least in part upon the dependency relationships; and
reporting information to an end user regarding the existence of violations of one or more of the plurality of desired characteristics by prioritizing reporting of one or more violations of one or more of the plurality of desired characteristics.

32. The method of claim 31, wherein each of the plurality of desired characteristics represents a condition that must hold true in order for the hardware design to operate in accordance with intended behavior of logical signals in the hardware design.

33. The method of claim 31 further comprising suppressing the reporting of one or more violations of one or more of the plurality of desired characteristics that are due to a common design defect of the hardware design.

34. The method of claim 31, wherein the hardware design is expressed in a hardware description language (HDL), and wherein information regarding the intended behavior of the logical signals is captured from semantics of the HDL.

35. The method of claim 31 wherein each of the plurality of desired characteristics are represented by one or more design verification checks.

36. The method of claim 35, wherein said determining dependency relationships among the plurality of desired characteristics includes for each design verification check associated with one or more of the plurality of desired characteristics:
disabling, in an internal representation of the hardware design, those of the design verification checks that are dependent on the design verification check,
evaluating the design verification check with reference to the internal representation of the hardware design, and
enabling all of the design verification checks associated with one or more of the plurality of desired characteristics in the internal representation of the hardware design in anticipation of subsequent dependency relationship analysis.

37. A machine-readable medium having stored thereon data representing instructions which, when executed by a processor, cause said processor to perform the following:
determining information regarding relationships among a plurality of verification attributes of a hardware design, each of the plurality of verification attributes representing a condition that must hold true in order for the hardware design to operate correctly in accordance with intended behavior of logical signals in the hardware design;
determining whether a violation of one or more of the plurality of verification attributes can occur by performing a verification process on a language representation of the hardware design; and
reporting results of the verification process based on the information regarding relationships among the plurality of verification attributes.

38. The machine-readable medium of claim 37, wherein the instructions further cause the processor to prioritize one or more of the plurality of verification attributes.

39. The machine-readable medium of claim 37, wherein said reporting the results of the verification process comprises:
associating a priority with each violation of the plurality of verification attributes; and
presenting the violations based upon their respective priorities.

40. The machine-readable medium of claim 37, wherein the instructions further cause the processor to determine whether each of the violations is a primary violation or secondary violation, primary violations representing violations of an independent verification attribute of the plurality of verification attributes that is independent of other verification attributes of the plurality of verification attributes and secondary violations representing violations of a dependent verification attribute of the plurality of verification attributes that is dependent upon one or more other verification attributes of the plurality of verification attributes and wherein only the primary violations are reported.

41. A method comprising:
a step for receiving a language representation of a hardware design;
a step for determining dependency relationships among a plurality of desired characteristics of the hardware design, each of the plurality of desired characteristics representing a condition that must hold true in order for the hardware design to operate in accordance with its intended operation;
a step for determining whether the hardware design contains one or more errors;
a step for reducing reported information that needs to be reviewed by an end user based upon the dependency relationships; and
wherein said step for determining whether the hardware design contains one or more errors by is streamlined by avoiding verification of one or more of the plurality of desired characteristics based upon the dependency relationships and information regarding existence of violations of the plurality of desired characteristics.

42. The method of claim 41, wherein said step for reducing reported information comprises suppressing the reporting of one or more violations of one or more of the plurality of desired characteristics that are due to a common design defect of the hardware design.

43. A method comprising:

receiving a language representation of a hardware design;

linking a plurality of desired characteristics of the hardware design by determining dependency relationships among the plurality of desired characteristics, each of the plurality of desired characteristics representing a condition that must hold true in order for the hardware design to operate in accordance with its intended operation;

determining whether the hardware design contains one or more errors by identifying one or more situations in which a violation of one or more of the plurality of desired characteristics can occur;

reducing reported information that needs to be reviewed by an end user based upon the dependency relationships among the plurality of desired characteristics by prioritizing reporting of one or more violations of one or more of the plurality of desired characteristics; and wherein said determining whether the hardware design contains one or more errors is streamlined by avoiding verification of one or more of the plurality of desired characteristics based upon the dependency relationships and information regarding existence of violations of the plurality of desired characteristics.

44. The method of claim 43, wherein said prioritizing reporting of one or more violations of one or more of the plurality of desired characteristics comprises suppressing the reporting of one or more violations of one or more of the plurality of desired characteristics that are due to a common design defect of the hardware design.

45. The method of claim 43, wherein each of the plurality of desired characteristics represented by one or more design verification checks.

46. The method of claim 45, wherein said determining dependency relationships among the plurality of desired characteristics includes for each design verification check associated with one or more of the plurality of desired characteristics:

disabling, in an internal representation of the hardware design, those of the design verification checks that are dependent on the design verification check, evaluating the design verification check with reference to the internal representation of the hardware design, and enabling all of the design verification checks associated with one or more of the plurality of desired characteristics in the internal representation of the hardware design in anticipation of subsequent dependency relationship analysis.

47. The method of claim 43, wherein said determining whether the hardware design contains one or more errors comprises performing simulation of the hardware design.

48. The method of claim 43, wherein said determining whether the hardware design contains one or more errors comprises performing formal analysis of the hardware design.

49. The method of claim 43, wherein said determining whether the hardware design contains one or more errors comprises performing functional verification of the hardware design.

50. The method of claim 43, wherein each of the plurality of desired characteristics represents a condition that must hold true in order for the hardware design to operate in accordance with intended behavior of logical signals in the hardware design.

51. The method of claim 50, wherein the hardware design is expressed in a hardware description language (HDL), and wherein information regarding the intended behavior of the logical signals is captured from semantics of the HDL.

52. A method comprising:

receiving a language representation of a hardware design;

linking a plurality of desired characteristics of the hardware design by determining dependency relationships among the plurality of desired characteristics, each of the plurality of desired characteristics representing a condition that must hold true in order for the hardware design to operate in accordance with its intended operation and in accordance with intended behavior of logical signals in the hardware design;

determining whether the hardware design contains one or more errors by identifying one or more situations in which a violation of one or more of the plurality of desired characteristics can occur; and reducing reported information that needs to be reviewed by an end user based upon the dependency relationships among the plurality of desired characteristics by prioritizing reporting of one or more violations of one or more of the plurality of desired characteristics.

53. The method of claim 52, wherein said prioritizing reporting of one or more violations of one or more of the plurality of desired characteristics comprises suppressing the reporting of one or more violations of one or more of the plurality of desired characteristics that are due to a common design defect of the hardware design.

54. The method of claim 52, wherein each of the plurality of desired characteristics are represented by one or more design verification checks.

55. The method of claim 54, wherein said determining dependency relationships among the plurality of desired characteristics includes for each design verification check associated with one or more of the plurality of desired characteristics:

disabling, in an internal representation of the hardware design, those of the design verification checks that are dependent on the design verification check, evaluating the design verification check with reference to the internal representation of the hardware design, and enabling all of the design verification checks associated with one or more of the plurality of desired characteristics in the internal representation of the hardware design in anticipation of subsequent dependency relationship analysis.

56. The method of claim 52, wherein said determining whether the hardware design contains one or more errors comprises performing simulation of the hardware design.

57. The method of claim 52, wherein said determining whether the hardware design contains one or more errors comprises performing formal analysis of the hardware design.

58. The method of claim 57, wherein said determining whether the hardware design contains one or more errors comprises performing functional verification of the hardware design.

59. The method of claim 57, wherein the hardware design is expressed in a hardware description language (HDL), and wherein information regarding the intended behavior of the logical signals is captured from semantics of the HDL.

* * * * *